(12) United States Patent
Towne et al.

(10) Patent No.: US 11,275,127 B2
(45) Date of Patent: Mar. 15, 2022

(54) DATA CONVERTER FALSE SATURATION DETECTOR

(71) Applicant: Allegro MicroSystems, LLC, Manchester, NH (US)

(72) Inventors: Jay M. Towne, Bow, NH (US); Peter Tengstrand, Auburn, NH (US); Devon Fernandez, Londonderry, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 58 days.

(21) Appl. No.: 16/715,492

(22) Filed: Dec. 16, 2019

(65) Prior Publication Data

US 2021/0181268 A1 Jun. 17, 2021

(51) Int. Cl.
*G01R 33/00* (2006.01)
*G01R 35/00* (2006.01)
*G01R 33/02* (2006.01)
*H03M 3/00* (2006.01)

(52) U.S. Cl.
CPC ......... *G01R 33/0023* (2013.01); *G01R 33/02* (2013.01); *G01R 35/00* (2013.01); *H03M 3/496* (2013.01)

(58) Field of Classification Search
CPC .... G01R 33/0023; G01R 33/02; G01R 35/00; H03M 3/496
See application file for complete search history.

(56) References Cited

U.S. PATENT DOCUMENTS

| 9,893,737 | B1* | 2/2018 | Keramat | H03M 1/124 |
| 2007/0150136 | A1* | 6/2007 | Doll | B60T 8/885 701/29.2 |
| 2016/0341800 | A1* | 11/2016 | Schapendonk | G01R 33/09 |
| 2018/0247522 | A1* | 8/2018 | Motz | H03M 1/1071 |
| 2019/0339101 | A1* | 11/2019 | Meyer | G01R 33/0017 |

* cited by examiner

*Primary Examiner* — Akm Zakaria
(74) *Attorney, Agent, or Firm* — Daly, Crowley, Mofford & Durkee, LLP

(57) ABSTRACT

According to aspects of the disclosure, an apparatus is disclosed comprising: a controller; an analog-to-digital converter (ADC) coupled to the controller, the ADC including an input terminal for receiving a sensor signal from a transducer; and a diagnostic circuit coupled to the input terminal of the ADC and to the controller, the diagnostic circuit being configured to: generate a diagnostic signal that indicates whether a voltage at the input terminal of the ADC meets a first threshold, and provide the diagnostic signal to the controller, wherein the controller is configured to: receive a data sample from the ADC, detect whether the data sample meets a second threshold, and transition the apparatus into a safe state when: (i) the diagnostic signal indicates that the voltage at the input terminal does not meet the first threshold, and (ii) the data sample meets the second threshold.

23 Claims, 6 Drawing Sheets

DATA CONVERTER FALSE SATURATION DETECTOR

BACKGROUND

An analog-to-digital converter (ADC) may receive an analog waveform and produce a set of digital data samples corresponding to the waveform. The ADC may have an input voltage range in which it can produce valid data samples. If the voltage of the waveform falls outside the valid input range of the ADC, clipping may occur and the ADC may produce invalid data samples, which do not accurately reflect the state of the waveform. Such invalid samples may include samples containing all zeroes or all ones, for example, and they may be indistinguishable from valid data samples that have the same value.

SUMMARY

According to aspects of the disclosure, a sensor is provided comprising: a controller; a transducer arranged to produce a first sensor signal and a second sensor signal; an analog-to-digital converter (ADC) having a first input terminal and a second input terminal, the first input terminal being arranged to receive the first sensor signal, and the second input terminal being arranged to receive the second sensor signal; and a diagnostic circuit configured to: generate a first diagnostic signal that indicates whether a first voltage at the first input terminal meets a first threshold, and provide the first diagnostic signal to the controller; and generate a second diagnostic signal that indicates whether a second voltage at the second input terminal meets the first threshold, and provide the second diagnostic signal to the controller, wherein the controller is configured to: receive a data sample from the ADC, detect whether the data sample meets a second threshold or a third threshold, when the data sample meets the second threshold: detect whether the first voltage exceeds the first threshold based on the first diagnostic signal, transition the sensor into a first safe state when the first voltage does not meet the first threshold, and generate an output signal based on the data sample when the first voltage meets the first threshold; when the data sample meets the third threshold: detect whether the second voltage meets the first threshold based on the second diagnostic signal, transition the sensor into a second safe state when the second voltage does not meet the first threshold, and generate an output signal based on the data sample when the second voltage meets the first threshold.

According to aspects of the disclosure, an apparatus is disclosed comprising: a controller; an analog-to-digital converter (ADC) coupled to the controller, the ADC including an input terminal for receiving a sensor signal from a transducer; and a diagnostic circuit coupled to the input terminal of the ADC and to the controller, the diagnostic circuit being configured to: generate a diagnostic signal that indicates whether a voltage at the input terminal of the ADC meets a first threshold, and provide the diagnostic signal to the controller, wherein the controller is configured to: receive a data sample from the ADC, detect whether the data sample meets a second threshold, and transition the apparatus into a safe state when: (i) the diagnostic signal indicates that the voltage at the input terminal does not meet the first threshold, and (ii) the data sample meets the second threshold.

According to aspects of the disclosure, a method is provided for use in a sensor, comprising: generating, by a diagnostic circuit, a diagnostic signal that indicates whether a voltage at an input terminal of an analog-to-digital converter (ADC) meets a first threshold; providing, by the diagnostic circuit, the diagnostic signal to a controller; receiving, by the controller, a data sample that is generated by the ADC; detecting, by the controller, whether the data sample meets a second threshold; and transitioning into a safe state when: (i) the diagnostic signal indicates that the voltage at the input terminal does not meet the first threshold, and (ii) the data sample meets the second threshold.

BRIEF DESCRIPTION OF THE DRAWINGS

The foregoing features of the invention, as well as the invention itself may be more fully understood from the following detailed description of the drawings, in which.

DETAILED DESCRIPTION

According to aspects of the disclosure, a sensor is provided that includes an analog-to-digital converter (ADC), a controller, and a diagnostic circuit. As is known in the art, an ADC may become saturated when the voltage at one or more input terminals of the ADC exceeds the valid input voltage range of the ADC. When the ADC becomes saturated, the ADC may start outputting faulty data. The diagnostic circuit may monitor the voltage at one or more input terminals of the ADC and provide the controller with a diagnostic signal that indicates that the ADC may indeed be saturated since the analog signal is close to the rail. The controller may monitor the diagnostic signal and transition the sensor into a safe state when the one or more data samples that are output from the ADC are equal (or close) to the full-scale low or full-scale high value for the ADC, but the diagnostic signal indicates the analog signal is not located near the rails and therefore the ADC should not be saturated.

Figure 1:
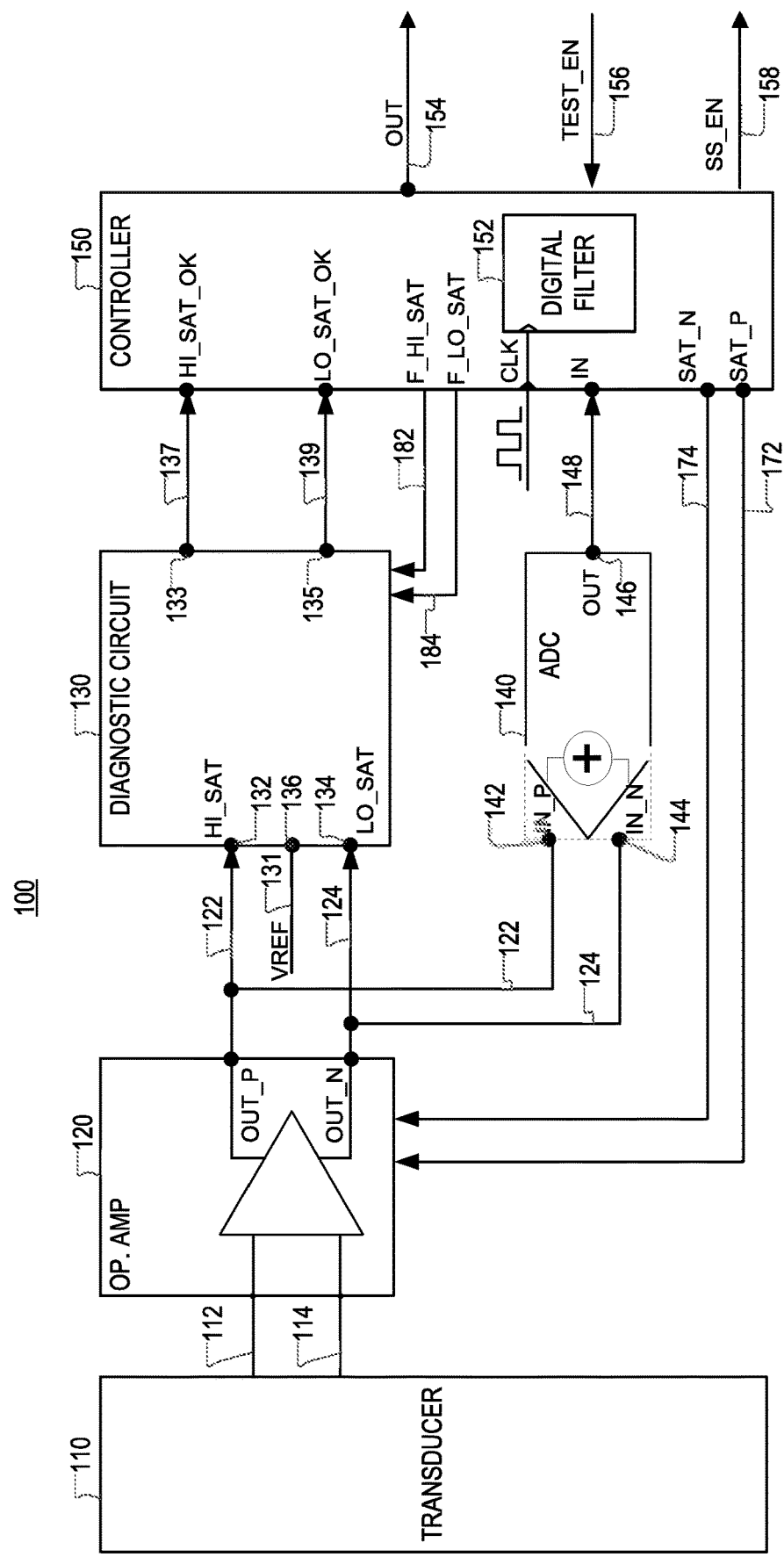
FIG. 1 is a diagram of an example of a sensor, according to aspects of the disclosure.

FIG. 1 is a schematic diagram of a sensor 100, according to aspects of the disclosure. The sensor 100 may include a transducer 110, an amplifier 120, a diagnostic circuit 130, an analog-to-digital converter (ADC) 140, and a controller 150. The transducer 110 may generate sensor signals 112, 114, and supply the sensor signals 112, 114 to the amplifier 120. The amplifier 120 may generate amplified sensor signals 122, 124, and output the sensor signals 122, 124 to the diagnostic circuit 130 and the ADC 140. According to the present example, signals 112, 114, 122, and 124 are voltage signals. According to the present example, the sensor signals 112 and 114 are the respective positive and negative components of the same differential signal that is output by the transducer 110. According to the present example, the sensor signal 122 and the sensor signal 124 are the respective positive and negative components of the same differential signal that is output from the amplifier 120.

The diagnostic circuit 130 may include an input terminal 132, an input terminal 134, an input terminal 136, an output terminal 133, and an output terminal 135. The sensor signal 122 may be received by the diagnostic circuit 130 at the input terminal 132, the sensor signal 124 may be received by the diagnostic circuit 130 at the input terminal 134, and a reference voltage 131 may be received by the diagnostic circuit 130 at the input terminal 136. The diagnostic circuit 130 may compare the sensor signal 122 to the reference voltage 131 and output (from the output terminal 133) a diagnostic signal 137 that indicates whether the value of the sensor signal 122 is above or below the reference voltage 131. Similarly, the diagnostic circuit 130 may also compare the sensor signal 124 to the reference voltage 131 and output a diagnostic signal 139 (from the output terminal 135) that indicates whether the value of the sensor signal 124 is above or below of the reference voltage 131.

The ADC 140 may include an input terminal 142, an input terminal 144, and an output terminal 146. As illustrated, the input terminal 142 of the ADC 140 may be coupled to the amplifier 120 and to the input terminal 132 of the diagnostic circuit 130. As a result of this coupling, the input terminal 142 of the ADC 140 may be arranged to receive the sensor signal 122. The other input terminal 144 of the ADC 140 may be coupled to the amplifier and the input terminal 134 of the diagnostic circuit 130. As a result of this coupling, the input terminal 144 may be arranged to receive the sensor signal 124. The ADC 140 may digitize the sensor signals 122 and 124 to produce a digital data stream 148, which is output from the output terminal 146, as shown. As can be readily appreciated, the data stream 148 may include a plurality of data samples that are generated by the ADC 140 based on the sensor signals 122 and 124.

The controller 150 may be configured to receive the data stream 148 and process the data stream 148 by using a digital filter 152. As a result of the processing, the controller 150 may generate an output data stream 154, and output the output data stream 154, as shown. The output data stream 154 may be fed to any external electronic device that is electrically coupled the sensor 100.

The controller 150 may be further configured to test whether the ADC 140 has failed when a minimum/maximum data sample value is received from the ADC 140. In doing so, the controller 150 may differentiate between "legitimate" minimum/maximum data sample values that are generated by the ADC 140 when the input voltage boundaries of the ADC 140 are exceeded, and "illegitimate" minimum/maximum data sample values, which are generated as a result of a malfunction of the ADC 140.

The minimum data sample value of the ADC 140 (e.g., a full-scale low value of the ADC) may be all 0s (e.g., "00000000" in the case of an 8-bit ADC). The maximum data sample value of the ADC 140 (e.g., a full-scale low value of the ADC) may be all 1s (e.g., "11111111" in the case of an 8-bit ADC). When the ADC 140 is operating normally, the minimum data sample value may be produced when the signal 122/124 is outside of the valid input voltage range of the ADC 140. Similarly, when the ADC 140 is operating normally, the maximum data sample value may be produced when signal 122/124 is outside of the valid input voltage range of the ADC 140. However, when the ADC 140 has failed, the minimum/maximum data sample values may be output when the signal 122/124 is within the valid input voltage range of the ADC 140. Under such circumstances, the output of the ADC 140 would not reflect the state of the signal 122/124, which in turn could lead to errors being introduced into the output data stream 154.

More specifically, when a data sample generated by the ADC 140 is received at the controller 150, the controller 150 may detect whether the received data sample is within a predetermined distance from the minimum and/or maximum data sample value for the ADC 140. If the received data sample is within a predetermined distance from the minimum and/or maximum data sample value for the ADC 140 (e.g., a full-scale high or full-scale low value of the ADC), the controller 150 may process the diagnostic signals 137 and 139 to detect whether the ADC 140 is saturated. If the ADC 140 is not saturated, this is an indication that the ADC has failed, and the controller 150 transitions the sensor 100 into a safe state. Otherwise, if the ADC 140 is saturated, this is an indication that the ADC 140 is working correctly and the sensor 100 need not be transitioned into a safe state.

According to the present example, transitioning the sensor 100 into a safe state may include discarding data samples that are received from the ADC 140. However, it will be understood that in some implementations, transitioning the sensor 100 into a safe state may include outputting an error code, activating a signal 158, resetting the ADC 140, and/or taking any other suitable type of action that prevents the controller 150 from outputting faulty data resulting from the saturation of the ADC 140.

The controller 150 may be further configured to output a signal 172 and a signal 174 to the amplifier 120. When active, the signal 172 may cause the amplifier 120 to saturate the input terminal 142 of the ADC 140 by assigning a value to the sensor signal 122 that exceeds the upper bound of the input voltage range of the ADC 140. When active, the signal 174 may cause the amplifier 120 to saturate the input terminal 144 of the ADC 140 by assigning a value to the sensor signal 124 that exceeds the upper bound of the input voltage range of the ADC 140. The operational amplifier may saturate the input terminal 144 of the ADC by assigning a value to the sensor signal 124 that exceeds the upper bound of the input voltage range of the ADC 140. Furthermore, the controller 150 may be configured to output a signal 182 and a signal 184 to diagnostic circuit 130. When active, the signal 182 may cause the diagnostic circuit 130 to set the signal 137 to a 'logic low' value (or another value that indicates that the input terminal 142 is not saturated). When active, the signal 184 may cause the diagnostic circuit 130 to set the signal 139 to a 'logic low' value (or another value that indicates that the input terminal 144 is not saturated).

In some implementations, the controller 150 may be configured to receive a signal 156 from an external device (not shown) and output a signal 158 back to the external device. The signals 156 and 158 may be used by the external device to test whether the controller 150 is working correctly. Specifically, when the signal 156 is activated, the controller 150 may execute a test sequence. The set sequence may include one or more of (1) activating signals 172 and 182 and/or (2) activating signals 174 and 184.

As discussed above, activating the signal 172 may cause the amplifier 120 to saturate the input terminal 142 of ADC 140, and activating the signal 182 may cause the diagnostic circuit 130 to set the diagnostic signal 137 to a 'logic low' value. Under such circumstances, if the controller 150 (or sensor 100) is working correctly, the controller 150 may transition the sensor 100 into a safe state and activate the signal 158. The external device (which is supplying the signal 156) may detect that the signal 158 has been activated and deduce that the controller 150 (and/or sensor 100) is working correctly. By contrast, if the signal 158 is not activated, the external device may deduce that the controller 150 (and/or sensor 100) is experiencing a failure.

Similarly, activating the signal 174 may cause the amplifier 120 to saturate the input terminal 144 of ADC 140, and activating the signal 184 may cause the diagnostic circuit 130 to set the diagnostic signal 139 to a 'logic low' value. Under such circumstances, if the controller 150 (or sensor 100) is working correctly, the controller 150 may transition the sensor 100 into a safe state and activate the signal 158. The external device (which is supplying the signal 156) may detect that the signal 158 has been activated and deduce that the controller 150 (and/or sensor 100) is working correctly. By contrast, if the signal 158 is not activated, the external device may deduce that the controller 150 (and/or sensor 100) is experiencing a failure.

According to aspects of the disclosure, the transducer 110 may include one or more Hall effect elements, Giant Magnetoresistive (GMR) elements, photodiodes, and/or any other suitable type of transducer. The sensor signals 112 and 114 may indicate the state of a stimulus, which the transducer 110 is configured to detect. For example, the level of the sensor signals 112 and 114 may indicate magnetic field intensity, magnetic field direction, light intensity, sound intensity, etc. In some implementations, the sensor signals 122, 124 may be generated (by the amplifier 120) by amplifying the sensor signals 112, 114. In this regard, the level of the sensor signals 122 and 124 may also indicate the state of the stimulus, which the transducer 110 is configured to detect. For example, the level of the sensor signals 122 and 124 may indicate magnetic field intensity, magnetic field direction, light intensity, sound intensity, etc.

The controller 150 may include an Application-Specific Integrated Circuit (ASIC), a Field-Programmable Gate Array (FPGA), a general-purpose processor, and/or any other suitable type of processing circuitry. The ADC 140 may include a sigma-delta converter (SDC) and/or any other suitable type of digital converter. It will be understood that the present disclosure is not limited to any specific type of controller and/or ADC being used in sensor 100.

The value of the reference voltage 131 may be dependent on the technical parameters of the ADC 140. In some implementations, the value of the reference voltage 131 may be equal to (or otherwise based on) the upper boundary of the valid input voltage range of the ADC 140. In some implementations, the input voltage range of the ADC 140 may be −2.8V to +2.8V. However, it will be understood that the present disclosure is not limited to any specific input voltage range. Although in the present example, the transducer 110, the amplifier 120, the diagnostic circuit 130, the ADC 140, and the controller 150 are formed on the same die, and contained in the same integrated circuit packaging, it will be understood that alternative implementations are possible in which one or more of the transducer 110, the amplifier 120, the diagnostic circuit 130, the ADC 140, and the controller 150 are not integrated in the same integrated circuit packaging with the rest.

Figure 2:
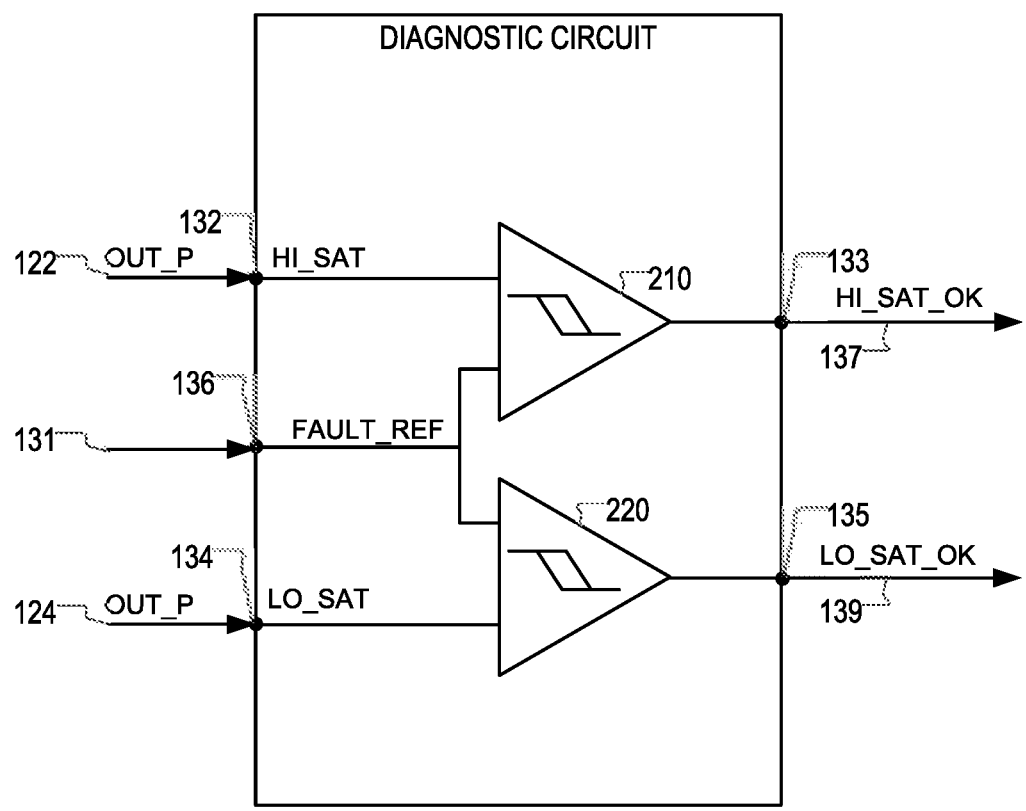
FIG. 2 is a diagram showing aspects of a diagnostic circuit that is part of the sensor of FIG. 1, according to aspects of the disclosure.

FIG. 2 shows portions of the diagnostic circuit 130 in further detail. As illustrated, the diagnostic circuit 130 may include a first voltage comparator 210 and a second voltage comparator 220. The first voltage comparator 210 may be configured to set the diagnostic signal 137 to a 'logic high' value when the value of the sensor signal 122 exceeds the reference voltage 131. Furthermore, the first voltage comparator 210 may be configured to set the diagnostic signal 137 to a 'logic low' value when the value of the sensor signal 122 is less than the reference voltage 131. The second voltage comparator 220 may be configured to set the diagnostic signal 139 to a 'logic high' value when the value of the sensor signal 124 exceeds the reference voltage 131. Furthermore, the second voltage comparator 220 may be configured to set the diagnostic signal 139 to a 'logic low' value when the absolute value of the sensor signal 124 is less than the reference voltage 131.

Figure 3A:
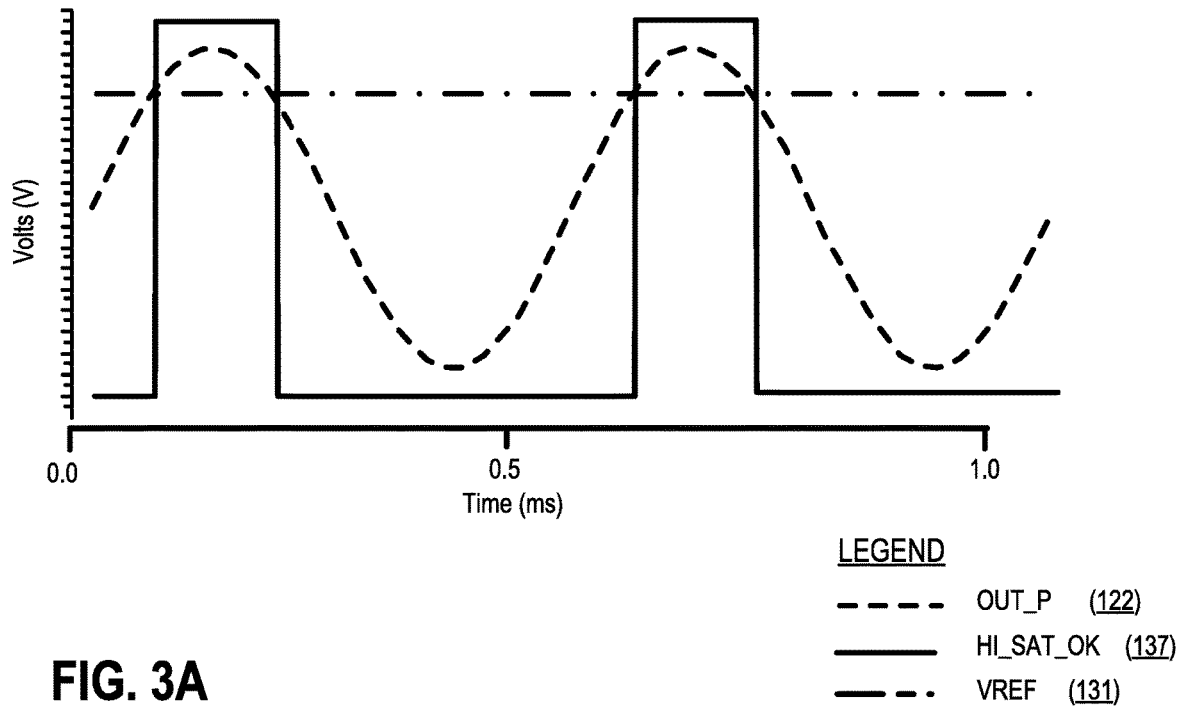
FIG. 3A is a plot illustrating the operation of the diagnostic circuit of FIG. 1, according to aspects of the disclosure.
Figure 3B:
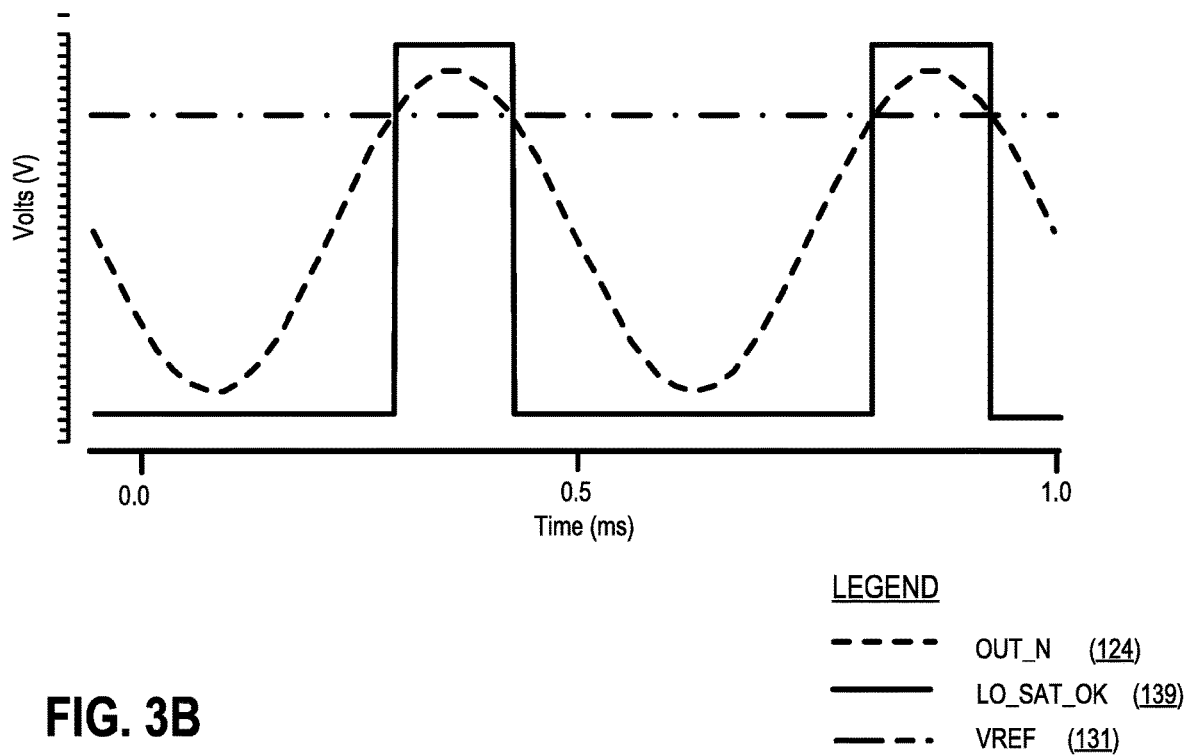
FIG. 3B is a plot illustrating the operation of the diagnostic circuit of FIG. 1, according to aspects of the disclosure.

FIGS. 3A-B illustrate the operation of the diagnostic circuit 130 in further detail. Shown in FIG. 3A-B are the values of the signals 122, 137, 124, 139, and 131 during the same 1-second period. As noted above, the sensor signals 122 and 124 may together be part of the same differential signal. When the voltage of the sensor signal 122 exceeds the reference voltage 131, the diagnostic signal 137 is switched to a 'logic high' value by the diagnostic circuit 130; and when the voltage of the sensor signal 122 falls below the reference voltage 131, the diagnostic signal 137 is switched back to a 'logic low' value by the diagnostic circuit. Similarly, when the voltage of the sensor signal 124 exceeds the reference voltage 131, the diagnostic signal 139 is switched to a 'logic high' value by the diagnostic circuit 130; and when the voltage of the sensor signal 124 falls below the reference voltage 131, the diagnostic signal 139 is switched back to a 'logic low' value by the diagnostic circuit.

Figure 4B:
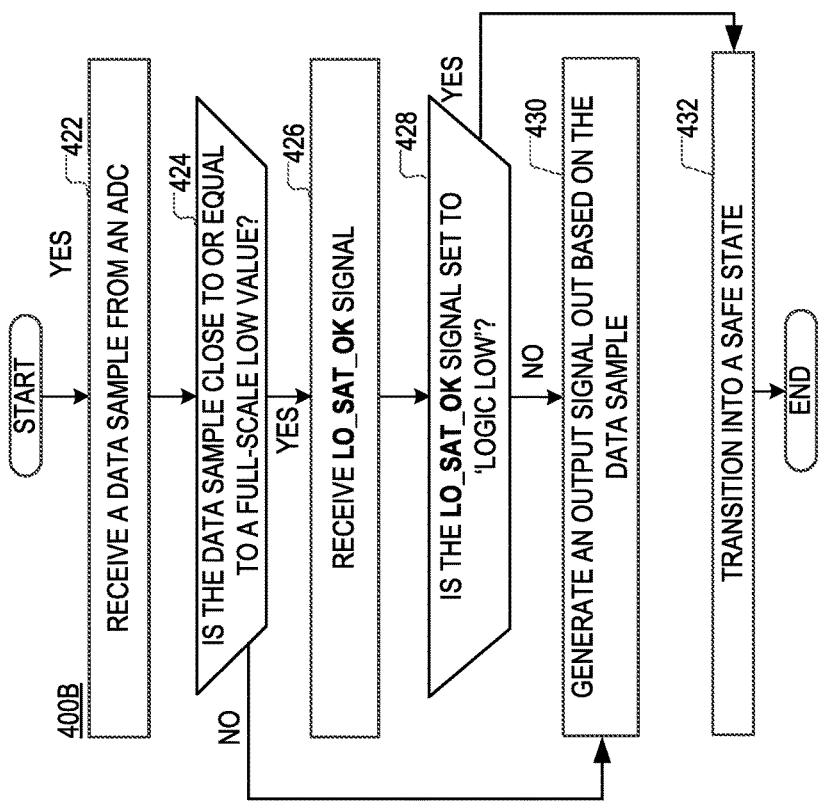
FIG. 4B is a flowchart of an example of a process, according to aspects of the disclosure.
Figure 4A:
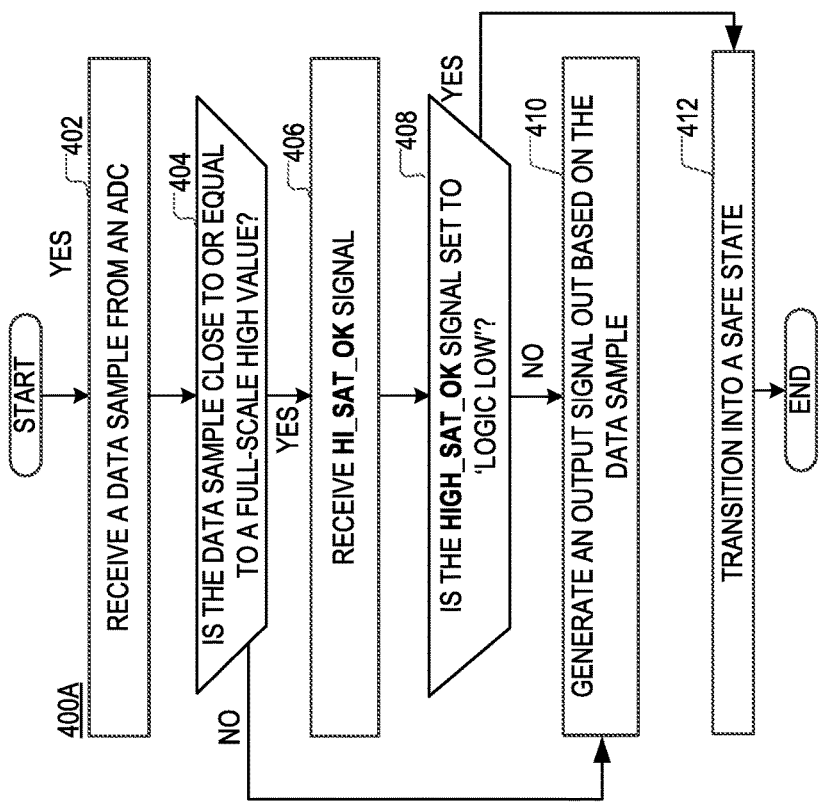
FIG. 4A is a flowchart of an example of a process, according to aspects of the disclosure.

FIG. 4A is a flowchart of an example of a process 400A that is performed by the controller 150, according to aspects of the disclosure.

At step 402, the controller 150 receives a data sample from ADC 140. At step 404, the controller 150 detects whether the data sample is the same as or within a predetermined distance from the maximum data sample value, which the ADC 140 is designed to output (e.g., the full-scale high value of the ADC 140). If the data sample is the same as or within the predetermined distance from the maximum data sample value, the process 400A proceeds to step 406. Otherwise, the process 400A proceeds to step 410.

At step 406, the controller 150 receives the diagnostic signal 137 from the diagnostic circuit 130. As noted above, the diagnostic signal 137 indicates whether the sensor signal 122 meets the reference voltage 131. If the value of the diagnostic signal 137 is 'logic high', this is an indication that the sensor signal 122 meets the reference voltage 131. Otherwise, if the value of the diagnostic signal 137 is 'logic low', this is an indication that the signal 122 does not meet the reference voltage 131. According to the present example, the reference voltage 131 is "met" by the sensor signal 122 when the value of the sensor signal 122 equals or exceeds the value of the reference voltage 131. Throughout the disclosure, and as indicated by context, the phrases "value of signal" and "voltage of signal" are used interchangeably.

At step 408, the controller 150 detects whether the value of the diagnostic signal 137 is 'logic low' (e.g., '0'). If the diagnostic signal 137 is set to 'logic high' (e.g., '1'), the process 400A proceeds to step 410. Otherwise, if the diagnostic signal 137 is set to a 'logic low', the process 400A proceeds to step 412.

At step 410, the controller 150 generates the output data stream 154 based on the data sample. In some implementations, the output data stream 154 may include the data sample itself or data that is generated by applying the digital filter 152 to the data sample.

At step 412, the controller 150 transitions the sensor 100 into a safe state. As used throughout the disclosure, the term "safe state" may refer to any set of one or more states that deviate from the ordinary operating state of the sensor 100. As noted above, in some implementations, transitioning the sensor 100 to a safe state may include discarding the data sample. In some implementations, discarding the data sample may include deleting the sample from a memory of the controller 150, seizing any further processing of the data sample, and/or taking any other suitable action which would prevent the data sample from affecting the output data stream 154.

Additionally or alternatively, in some implementations, transitioning the sensor 100 into the safe state may include outputting an error code indicating that the diagnostic circuit 130 is not working correctly. Additionally or alternatively, in some implementations, transitioning the sensor 100 into the safe state may include activating the signal 158. Additionally or alternatively, in some implementations, transitioning the sensor 100 into the safe state may include resetting the ADC 140 (e.g., by powering the ADC 140 off and on) or resetting the amplifier 120 (e.g., by powering the amplifier off and on). Stated succinctly, the present disclosure is not limited to any specific type of safe state.

FIG. 4B is a flowchart of an example of a process 400B that is performed by the controller 150, according to aspects of the disclosure.

At step 422, the controller 150 receives a data sample from ADC 140. At step 424, the controller 150 detects whether the data sample is the same as or within a predetermined distance from the minimum data sample value, which the ADC 140 is designed to output (e.g., the full-scale low value of the ADC 140). If the threshold is the same as or within the predetermined distance from the minimum data sample value, the process 400B proceeds to step 426. Otherwise, the process 400B proceeds to step 430.

At step 426, the controller 150 receives the diagnostic signal 139 from the diagnostic circuit 130. As noted above, the diagnostic signal 139 indicates whether the sensor signal 124 meets the reference voltage 131. If the value of the diagnostic signal 139 is 'logic high', this is an indication that the sensor signal 124 meets the reference voltage 131. Otherwise, if the value of the diagnostic signal 139 is 'logic low', this is an indication that the signal 124 does not meet the reference voltage 131.

At step 428, the controller 150 detects whether the value of the diagnostic signal 139 is 'logic low' (e.g., '0'). If the diagnostic signal 139 is set to 'logic high' (e.g., '1'), the process 400B proceeds to step 430. Otherwise, if the diagnostic signal 139 is set to 'logic low', the process 400B proceeds to step 432.

At step 430, the controller 150 generates the output data stream 154 based on the data sample. In some implementations, the output data stream 154 may include the data sample itself or data that is generated by applying the digital filter 152 to the data sample.

At step 432, the controller 150 transitions the sensor 100 into a safe state. Step 432 may be performed in the same manner as step 412, which is discussed above with respect to FIG. 4A.

Although, the processes 400A and 400B are presented as separate processes in the present example, it will be understood that in some implementations they can be combined into a single process. In such implementations, when a data sample is produced by the ADC 140, the controller 150 may detect whether the data sample is close to the minimum or maximum data sample value, which the ADC is designed to output. If the data sample is close to the maximum value, the controller may detect whether diagnostic signal 137 is active. If the diagnostic signal 137 is active, the controller 150 may process the data sample in a normal fashion. If the diagnostic signal 137 is not active, the controller 150 may transition the sensor 100 into a safe state. On the other hand, if the data sample is close to the minimum value, the controller may detect whether diagnostic signal 139 is active. If the diagnostic signal 139 is active, the controller 150 may process the data sample in a normal fashion. If the diagnostic signal 139 is not active, the controller 150 may transition the sensor 100 into a safe state.

Figure 5B:
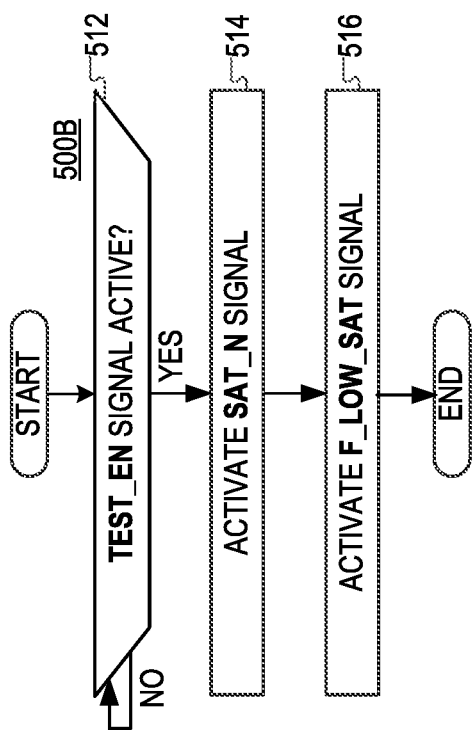
FIG. 5B is a flowchart of an example of a process, according to aspects of the disclosure.
Figure 5A:
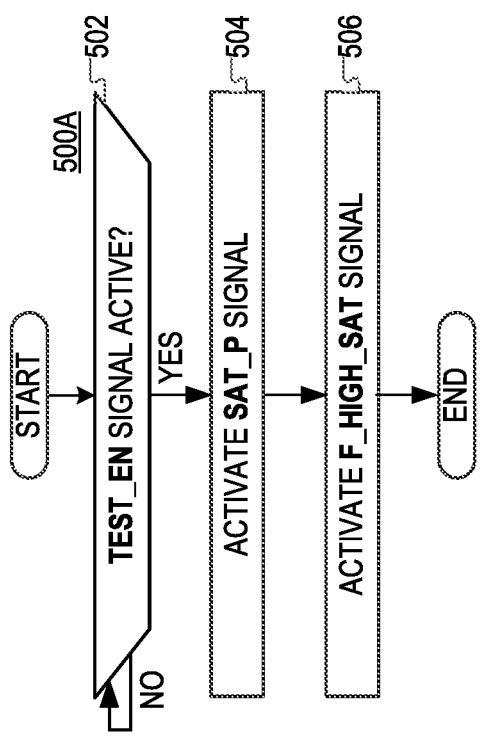
FIG. 5A is a flowchart of an example of a process, according to aspects of the disclosure.

FIG. 5A is a flowchart of an example of a process 500A, according to aspects of the disclosure. At step 502, the controller 150 detects whether the signal 156 has been activated by an external device (not shown). If the signal 156 is active, the process 500A proceeds to step 504. Otherwise, if the signal 156 is inactive, step 502 is executed again. At step 504, the signal 172 is activated. At step 506, the signal 182 is activated. As discussed above, activating the signal 172 may cause the amplifier 120 to saturate the input terminal 142 of ADC 140, and activating the signal 182 may cause the diagnostic circuit 130 to set the diagnostic signal 137 to a 'logic low' value. Under such circumstances, if the controller 150 (or sensor 100) is working correctly, (when process 400A is executed) the controller 150 would transition the sensor 100 into a safe state and activate the signal 158. The external device may subsequently detect that the signal 158 has been activated and deduce that the controller 150 (and/or sensor 100) is working correctly. By contrast, if the signal 158 is not activated, the external device may deduce that the controller 150 (and/or sensor 100) is experiencing a failure.

FIG. 5B is a flowchart of an example of a process 500B, according to aspects of the disclosure. At step 512, the controller 150 detects whether the signal 156 has been activated by an external device (not shown). If the signal 156 is active, the process 500B proceeds to step 514. Otherwise, if the signal 156 is inactive, step 512 is executed again. At step 514, the signal 174 is activated. At step 516, the signal 184 is activated. As discussed, above, activating the signal 174 may cause the amplifier 120 to saturate the input terminal 144 of ADC 140, and activating the signal 184 may cause the diagnostic circuit 130 to set the diagnostic signal 139 to a 'logic low' value. Under such circumstances, if the controller 150 (or sensor 100) is working correctly, (when processes 400B is executed) the controller 150 would transition the sensor 100 into a safe state and activate the signal 158. The external device may subsequently detect that the signal 158 has been activated and deduce that the controller 150 (and/or sensor 100) is working correctly. By contrast, if the signal 158 is not activated, the external device may deduce that the controller 150 (and/or sensor 100) is experiencing a failure.

Figure 6:
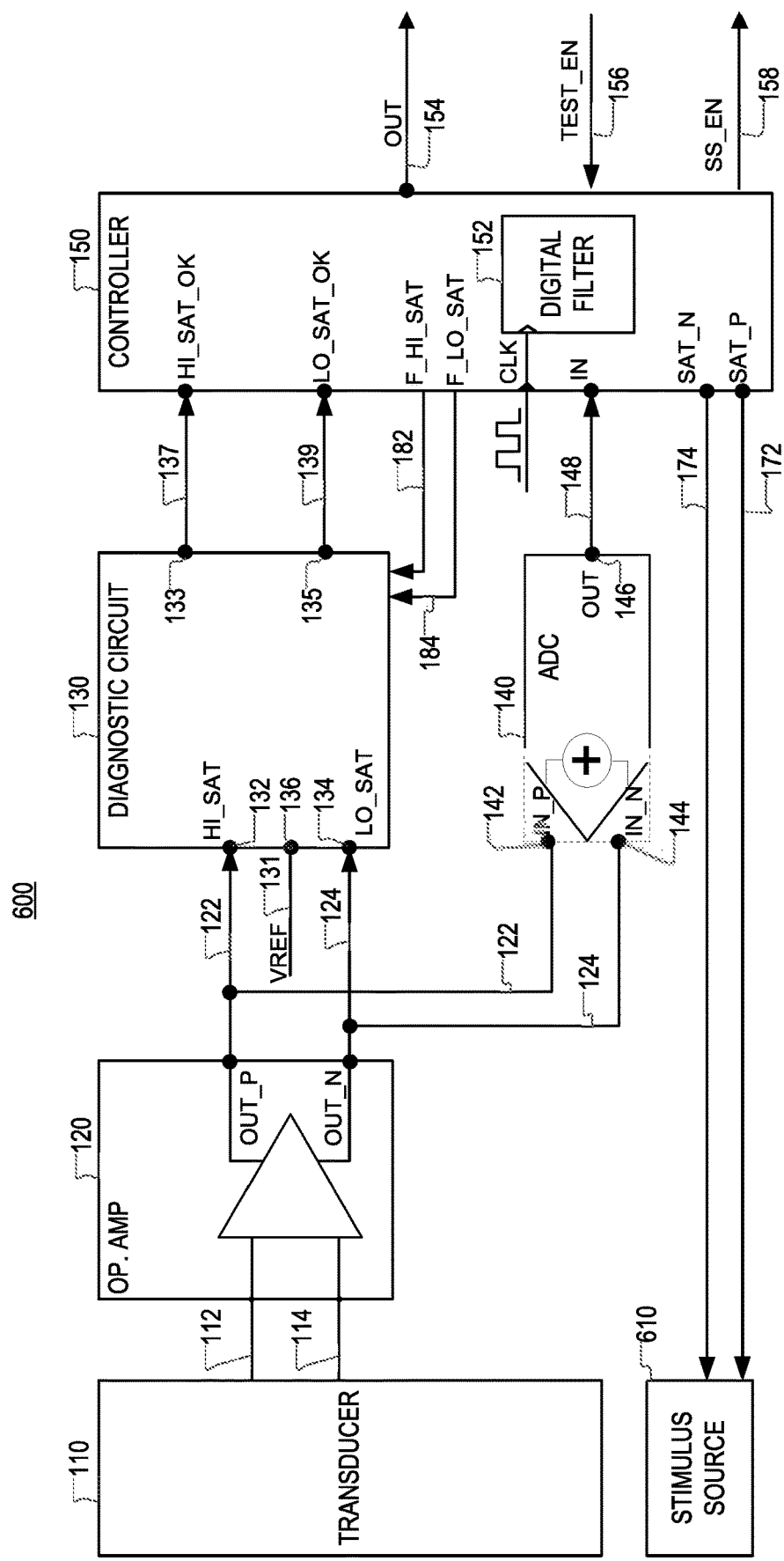
FIG. 6 is a diagram of an example of a sensor, according to aspects of the disclosure.

FIG. 6 is a schematic diagram of a sensor 600, according to aspects of the disclosure. According to the present example, the sensor 600 is identical to the sensor 100, but for including a stimulus source 610, which is arranged to receive the signals 172 and 174. When the stimulus source 610 may include any device or element that is arranged to produce a stimulus that is detectable by the transducer 110. For example, when the transducer 110 is a magnetic field sensing element, the stimulus source 610 may be an electromagnet. As another example, when the transducer 110 is a photodiode, the stimulus source 610 may be a light source, etc.

In some implementations, the stimulus source 610 may be used to force the input terminals 142 and 144 into a saturated state, when the controller 150 (sensor 600) is tested by an external device. For example, when the signal 172 is activated, the stimulus source 610 may be configured to produce a first stimulus (e.g., a first magnetic field), which, when received by the transducer 110, would cause the transducer 110 to saturate the input terminal 142. Similarly, when the signal 174 is activated, the stimulus source 610 may be configured to produce a second stimulus (e.g., a second magnetic field), which when received by the transducer 110, would cause the transducer 110 to saturate the input terminal 142.

FIGS. 1-6 are provided as an example only. At least some of the steps discussed with respect FIGS. 1-6 can be performed in a different order, concurrently, or altogether omitted. Although in the example of FIGS. 1-6, the diagnostic circuit 130 is described in the context of a sensor, the present disclosure is not limited thereto. In this regard, it will be understood that the diagnostic circuit 130 may be deployed in any electronic device that uses analog-to-digital converters.

Although in the example of FIGS. 1-6 the transducer 110 has a differential output, alternative implementations are possible in which the transducer 110 has a non-differential output. Although in the example of FIGS. 1-6 the ADC 140 has a differential input, alternative implementations are possible in which the ADC 140 has a non-differential input. In implementations in which the transducer 110 and the ADC 140 have non-differential inputs/outputs, two different thresholds may be used. One of the thresholds may be close to (or equal to) the high rail of the ADC 140 (e.g., same as or close to the upper bound of the valid input voltage range of the ADC) and the other one of the thresholds may be equal to the low rail of the ADC (e.g., same as or close to the lower bound of the valid input voltage range of the ADC). When the input voltage at the ADC 140 exceeds the first threshold, the diagnostic circuit 130 may be configured to set the HIGH_SAT_OK signal to a 'logic high' value. Similarly, when the input voltage at the ADC 140 exceeds the first threshold, the diagnostic circuit 130 may be configured to set the LOW_SAT_OK signal to a 'logic high' value.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A sensor comprising:
   a controller;
   a transducer arranged to produce a first sensor signal and a second sensor signal;
   an analog-to-digital converter (ADC) having a first input terminal and a second input terminal, the first input terminal being arranged to receive the first sensor signal, and the second input terminal being arranged to receive the second sensor signal; and
   a diagnostic circuit configured to:
      generate a first diagnostic signal that indicates whether a first voltage at the first input terminal meets a first threshold, and provide the first diagnostic signal to the controller; and
      generate a second diagnostic signal that indicates whether a second voltage at the second input terminal meets the first threshold, and provide the second diagnostic signal to the controller,
   wherein the controller is configured to:
      receive a data sample that is generated by the ADC,
      detect whether the data sample meets a second threshold or a third threshold, the second threshold being based on a full-scale low value of the ADC and the third threshold being based on a full-scale high value of the ADC;
      when the data sample meets the second threshold: detect whether the first voltage exceeds the first threshold based on the first diagnostic signal, transition the sensor into a first safe state when the first voltage does not meet the first threshold, and generate an output signal based on the data sample when the first voltage meets the first threshold;
      when the data sample meets the third threshold: detect whether the second voltage meets the first threshold based on the second diagnostic signal, transition the sensor into a second safe state when the second voltage does not meet the first threshold, and generate an output signal based on the data sample when the second voltage meets the first threshold.

2. The sensor of claim 1, wherein the diagnostic circuit includes:
   a first voltage comparator that is arranged to compare the first sensor signal to the first threshold, and output the first diagnostic signal based on an outcome of the comparison of the first sensor signal to the first threshold; and
   a second voltage comparator that is arranged to compare the second sensor signal to the first threshold, and output the second diagnostic signal based on an outcome of the comparison of the second sensor signal to the first threshold.

3. The sensor of claim 1, wherein generating the first diagnostic signal includes imparting a first value on the first diagnostic signal when the first voltage meets the first threshold, and imparting a second value on the first diagnostic signal when the first voltage does not meet the first threshold.

4. The sensor of claim 1, wherein transitioning the sensor into the first safe state includes discarding the data sample.

5. The sensor of claim 1, wherein transitioning the sensor into the first safe state includes at least one of resetting the ADC and outputting an error code.

6. The sensor of claim 1, wherein the ADC includes a sigma-delta converter.

7. The sensor of claim 1, wherein the transducer includes at least one of a giant magnetoresistance (GMR) sensing element, a Hall effect element, and a tunnel magnetoresistance (TMR) element.

8. The sensor of claim 1, wherein the controller is further configured to execute a test sequence in response to a predetermined input, the test sequence including causing the first voltage to exceed the first threshold and forcing the diagnostic circuit to set the first diagnostic signal to a first predetermined value.

9. The sensor of claim 8, wherein performing the test sequence further includes causing the second voltage to exceed the first threshold and forcing the diagnostic circuit to set the second diagnostic signal to a second predetermined value.

10. An apparatus comprising:
    a controller;

an analog-to-digital converter (ADC) coupled to the controller, the ADC including an input terminal for receiving a sensor signal from a transducer; and a diagnostic circuit coupled to the input terminal of the ADC and to the controller, the diagnostic circuit being configured to: generate a diagnostic signal that indicates whether a voltage at the input terminal of the ADC meets a first threshold, and provide the diagnostic signal to the controller, wherein the controller is configured to: receive a data sample that is generated by the ADC, detect whether the data sample meets a second threshold, and transition the apparatus into a safe state when: (i) the diagnostic signal indicates that the voltage at the input terminal does not meet the first threshold, and (ii) the data sample meets the second threshold, wherein the second threshold is based on one of a full-scale low value of the ADC or a full-scale high value of the ADC.

11. The apparatus of claim 10, wherein the diagnostic circuit includes a voltage comparator that is arranged to compare the voltage to the first threshold, and output the diagnostic signal based on an outcome of the comparison.

12. The apparatus of claim 10, wherein generating the diagnostic signal includes imparting a first value on the diagnostic signal when the voltage at the input terminal of the ADC meets the first threshold, and imparting a second value on the diagnostic signal when the voltage at the input terminal of the ADC does not meet the first threshold.

13. The apparatus of claim 10, wherein the controller is further configured to generate an output signal based on the data sample when: (i) the diagnostic signal indicates that the voltage at the input terminal meets the first threshold, and (ii) the data sample meets the second threshold.

14. The apparatus of claim 10, wherein transitioning the apparatus into the safe state includes discarding one or more data samples that are received from the ADC.

15. The apparatus of claim 10, wherein transitioning the apparatus into the safe state includes at least one of resetting the ADC and outputting an error code.

16. The apparatus of claim 10, wherein the ADC includes a sigma-delta converter.

17. The apparatus of claim 10, wherein the transducer includes at least one of a giant magnetoresistance (GMR) sensing element, a Hall effect element, and a tunnel magnetoresistance (TMR) element.

18. The apparatus of claim 10, wherein the controller is further configured to execute a test sequence in response to a predetermined input, the test sequence including causing the voltage at the input terminal to exceed the first threshold and forcing the diagnostic circuit to set the diagnostic signal to a predetermined value.

19. A method for use in a sensor, comprising:

generating, by a diagnostic circuit, a diagnostic signal that indicates whether a voltage at an input terminal of an analog-to-digital converter (ADC) meets a first threshold;

providing, by the diagnostic circuit, the diagnostic signal to a controller;

receiving, by the controller, a data sample that is generated by the ADC;

detecting, by the controller, whether the data sample meets a second threshold; and transitioning into a safe state when: (i) the diagnostic signal indicates that the voltage at the input terminal does not meet the first threshold, and (ii) the data sample meets the second threshold, wherein the second threshold is based on one of a full-scale low value of the ADC or a full-scale high value of the ADC.

20. The method of claim 19, further comprising executing a test sequence in response to a predetermined input, the test sequence including causing the voltage at the input terminal to exceed the first threshold and forcing the diagnostic circuit to set the diagnostic signal to a predetermined value.

21. The apparatus of claim 10, wherein the full-scale low value of the ADC includes a minimum value which the ADC is configured to produce, and the full-scale high value of the ADC includes a maximum value which the ADC is configured to produce.

22. The method of claim 1, wherein the full-scale low value of the ADC includes a minimum value which the ADC is configured to produce, and the full-scale high value of the ADC includes a maximum value which the ADC is configured to produce.

23. The method of claim 19, wherein the full-scale low value of the ADC includes a minimum value which the ADC is configured to produce, and the full-scale high value of the ADC includes a maximum value which the ADC is configured to produce.

* * * * *